(12) United States Patent
Arnold et al.

(10) Patent No.: US 9,588,164 B2
(45) Date of Patent: Mar. 7, 2017

(54) METHOD AND DEVICE FOR MONITORING A HIGH-VOLTAGE ARRANGEMENT

(71) Applicant: VOLKSWAGEN AG, Wolfsburg (DE)

(72) Inventors: Hans-Peter Arnold, Peine (DE); Uwe Lachmund, Berlin (DE)

(73) Assignee: Volkswagen AG (DE)

( * ) Notice: Subject to any disclaimer, the term of this patent is extended or adjusted under 35 U.S.C. 154(b) by 177 days.

(21) Appl. No.: 14/359,128

(22) PCT Filed: Nov. 6, 2012

(86) PCT No.: PCT/EP2012/004621
§ 371 (c)(1),
(2) Date: May 19, 2014

(87) PCT Pub. No.: WO2013/072028
PCT Pub. Date: May 23, 2013

(65) Prior Publication Data
US 2014/0292346 A1 Oct. 2, 2014

(30) Foreign Application Priority Data

Nov. 19, 2011 (DE) .......................... 10 2011 118 954

(51) Int. Cl.
*G01R 31/00* (2006.01)
*B60L 3/00* (2006.01)
(Continued)

(52) U.S. Cl.
CPC .......... *G01R 31/005* (2013.01); *B60L 3/0069* (2013.01); *B60L 3/04* (2013.01);
(Continued)

(58) Field of Classification Search
CPC ....... B60L 3/0069; B60L 3/04; G01R 31/026; G01R 31/005; G01R 31/006; G01R 31/083
(Continued)

(56) References Cited

U.S. PATENT DOCUMENTS 5,481,194 A * 1/1996 Schantz .................. B60L 1/003
324/509
5,986,860 A * 11/1999 Scott .................... G01R 31/025
361/115
(Continued)

FOREIGN PATENT DOCUMENTS

DE        10049196 A1     4/2002
DE    102008021542 A1    11/2009
(Continued)

OTHER PUBLICATIONS

Office Action for Japanese Patent Application No. 2014-541558; May 22, 2015.
(Continued)

*Primary Examiner* — Patrick Assouad
*Assistant Examiner* — Demetrius Pretlow
(74) *Attorney, Agent, or Firm* — Barnes & Thornburg LLP

(57) ABSTRACT

Devices and methods for monitoring a high-voltage arrangement wherein a current loop runs through elements of the high-voltage arrangement that are monitored. Voltages are sensed on at least three points of the current loop. On the basis of the sensed voltages, an interruption of the current loop is detected and, in response, a high-voltage supply is interrupted. The interruption is localized on the basis of the sensed voltages.

12 Claims, 2 Drawing Sheets

(51) Int. Cl.
*B60L 3/04* (2006.01)
*G01R 31/02* (2006.01)
*G01R 31/08* (2006.01)

(52) U.S. Cl.
CPC .......... *G01R 31/026* (2013.01); *G01R 31/006* (2013.01); *G01R 31/083* (2013.01)

(58) Field of Classification Search
USPC ................................................ 324/503, 522
See application file for complete search history.

(56) References Cited

U.S. PATENT DOCUMENTS

| | | | | |
|---|---|---|---|---|
| 2001/0041955 | A1* | 11/2001 | Nada ...................... | B60K 6/445 |
| | | | | 701/29.2 |
| 2004/0058586 | A1 | 3/2004 | Blutbacher | |
| 2004/0150410 | A1* | 8/2004 | Schoepf ................... | H02H 3/30 |
| | | | | 324/536 |
| 2007/0013382 | A1 | 1/2007 | Hinz et al. | |
| 2011/0037317 | A1* | 2/2011 | Kuschnarew ....... | B60L 11/1887 |
| | | | | 307/9.1 |
| 2012/0203479 | A1* | 8/2012 | Yadav .................... | H02H 7/261 |
| | | | | 702/58 |

FOREIGN PATENT DOCUMENTS

| | | |
|---|---|---|
| DE | 102009050223 A1 | 5/2011 |
| DE | 102009054469 A1 | 6/2011 |
| DE | 102011118954 A1 | 5/2013 |
| JP | 2004053554 A | 2/2004 |
| JP | 2011514282 A | 5/2011 |
| WO | 2009112165 A2 | 9/2009 |

OTHER PUBLICATIONS

Search Report for International Patent Application No. PCT/2012/004621; Sep. 30, 2013.

* cited by examiner

METHOD AND DEVICE FOR MONITORING A HIGH-VOLTAGE ARRANGEMENT

PRIORITY CLAIM

This patent application is a U.S. National Phase of International Patent Application No. PCT/EP2012/004621, filed 6 Nov. 2012, which claims priority to German Patent Application No. 10 2011 118 954.1, filed 19 Nov. 2011, the disclosures of which are incorporated herein by reference in their entirety.

SUMMARY

Illustrative embodiments relate to methods and devices for monitoring a high-voltage arrangement, in particular in a vehicle. A high-voltage arrangement is understood to be, in particular, an arrangement in which voltages >25 volts, for example voltages >60 volts, can occur, for example, in the field of 400 volts. In particular, this includes voltages of the voltage class B which comprises, for direct voltages, voltages between 60 volts and 500 volts, and for alternating voltages, voltages between 25 volts and 1,000 volts.

BRIEF DESCRIPTION OF THE DRAWINGS

The invention will be explained in more detail below on the basis of exemplary embodiments and with reference to the appended drawings of which.

DETAILED DESCRIPTION OF THE DISCLOSED EMBODIMENTS

Figure 1:
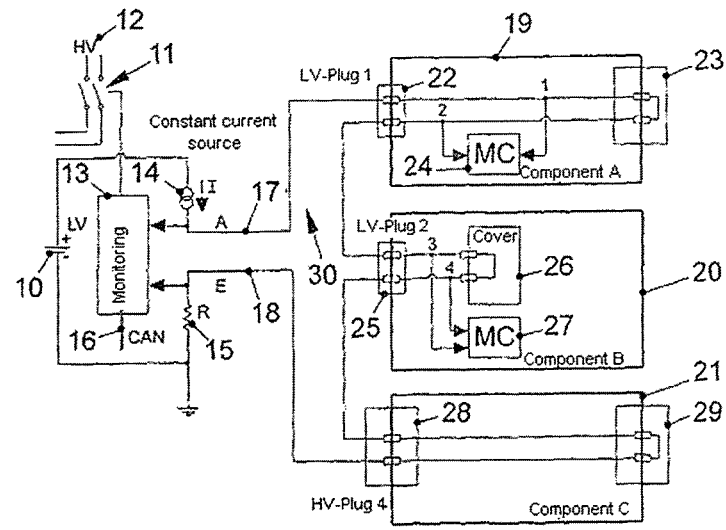
FIG. 1 shows a device for monitoring a high-voltage arrangement according to a first exemplary embodiment.

The disclosed embodiments make available methods and devices which run through a multiplicity of elements, to be monitored, of a high-voltage arrangement, wherein a change in a state of at least one of the elements to be monitored leads to an interruption in the current loop. In addition, voltages are sensed at at least three points on the current loop. As a function of the sensed voltages, an interruption in the current loop is detected, and when an interruption is present a voltage supply of the high-voltage arrangement is interrupted, for example. In addition, the location of the interruption in the current loop is determined as a function of the at least three voltages. Following the interruption, the high-voltage arrangement can then be discharged.

The location of an interruption can be determined by virtue of the fact that therefore not only two voltages are monitored, for example at a start and end of the current loop, but rather at least three voltages, wherein the accuracy of the location-determining process depends, for example, on a number of the at least three voltages. In general, the location can be determined all the more accurately the more voltages are sensed at different points on the current loop.

In at least one exemplary embodiment, the voltages of at least three points comprise a first voltage at a start of the current loop, a second voltage at an end of the current loop and at least one further voltage at at least one further point between the start and the end. In such a case, the interruption can be detected only as a function of the first voltage and the second voltage, while the at least one further voltage is also used to determine the location.

The elements which are to be monitored can be arranged in one or more components of the high-voltage arrangement, wherein the sensing of the at least one further voltage can take place by means of a monitoring device within the respective component, wherein the monitoring device can be, in particular, a microcontroller or other processor unit which is present in any case in the respective component. Such a processor unit can also be used to sense one or more voltages of the at least one further voltages in other components, in particular other components which do not have a separate processor unit.

Of course, the method can also be applied to two or more current loops.

The monitoring of the first voltage and of the second voltage can take place by means of a monitoring device which is located outside the high-voltage arrangement or else by means of one of the abovementioned processor units within a component of the high-voltage arrangement.

According to another disclosed embodiment, a device for monitoring a high-voltage arrangement is made available, comprising a current loop which runs through a multiplicity of elements, to be monitored, of the high-voltage arrangement, wherein a change in a state of at least one of the elements, to be monitored, leads to an interruption in the current loop; a current source which is coupled to the current loop; and a monitoring device which is configured to sense voltages at at least three points of the current loop, wherein the monitoring device is also configured to detect an interruption in the current loop as a function of the voltages, to interrupt a voltage supply of the high-voltage arrangement in the event of an interruption being detected, and/or to discharge the high-voltage arrangement and to determine the location of the detected interruption as a function of the voltages.

The monitoring device can comprise here, in particular, a processor unit, for example a microcontroller, for sensing a voltage at a point on the current loop within a component of the high-voltage arrangement. Additionally or alternatively, the monitoring device can also comprise a monitoring apparatus which is external to the high-voltage arrangement.

The device can be configured, in particular, to carry out one or more of the methods described hereinabove.

In the text which follows, disclosed embodiments are explained in detail. In this context, features of various exemplary embodiments can be combined with one another unless stated otherwise. On the other hand, a description of a disclosed embodiment with a multiplicity of features should not be interpreted as meaning that all of these features are necessary to carry out the invention. In particular, other exemplary embodiments can have fewer features and/or alternative features.

In the exemplary embodiment in FIG. 1, a high-voltage arrangement comprises as an example a component A 19, a component B 20 and a component C 21. Such components can comprise, for example, an electric motor of an electric vehicle or of a hybrid vehicle, an air-conditioning system or a high-voltage battery. Such components may at least partially conduct a high voltage which is potentially hazardous for humans, in particular a voltage of the voltage class B as explained at the beginning.

The component A 19 has here, for example, a low-voltage plug 22 and a high-voltage plug 23, the component B 20 has a low-voltage plug 2 and a cover 26, and the component C 21 has a high-voltage plug 28 and a high-voltage plug 29. When one of the plugs 22, 23, 25, 28, 29 is unplugged or when the cover 26 is opened there is the risk of a person coming into contact with the high voltage and therefore in this case the high voltage shall as far as possible be switched off. In FIG. 1 the high voltage is symbolized by a high-voltage source 12.

To monitor the abovementioned elements 22, 23, 25, 26, 28, 29, to be monitored, of the high-voltage arrangement, a current loop 30 is led through these components as illustrated, where this current loop 30 has a start A 17 and an end E 18 and is supplied with a constant current via a low-voltage source 10, for example a 12 volt battery or a 24 volt battery as are conventionally found in motor vehicles, and a constant current source 14. A resistor 15 is arranged between the end E 18 and the low-voltage source 10. As is apparent from FIG. 1, the current loop 30 is interrupted as soon as one of the plugs 22, 23, 25, 28, 29 is at least partially unplugged or the cover 26 is opened.

The number of illustrated elements, to be monitored, is, of course, to be understood only as an example and in other exemplary embodiments more, fewer or else other elements can also be present. The number of three components 19, 20 and 21 is also merely to be considered an example.

A monitoring apparatus 13 monitors first voltage at the start A 17 of the current loop and a second voltage at the end E 18 of the current loop 30. As long as the current loop 30 is closed, the first voltage is at least approximately equal to the second voltage since the electrical resistance of the closed current loop 30 is low. If, on the other hand, the current loop 30 is interrupted, the voltage difference between the first voltage and the second voltage is relatively large.

The monitoring apparatus 13 is therefore configured to detect an interruption in the current loop 30 if a difference between the first voltage and the second voltage exceeds a predefined threshold value. In this case, the monitoring apparatus 13 can actuate a switch 11 and therefore interrupt the high-voltage supply 12. Additionally or as an alternative, for example a suitable connection for conducting away remaining charge in the high-voltage arrangement can also be closed, for example a connection to ground to ensure a rapid discharging.

To permit more precise determination of the location of the interruption of the current loop 30, the voltage is monitored at points on the current loop 30 other than the start A 17 and the end E 18, in the example in FIG. 1 at four further points which are denoted by Arabic numerals 1-4. The points 1 and 2 are located here in the component A 19, while the points 3 and 4 are located in the component B 20. Basically, the present disclosure is, however, not defined as having four additional points but rather any desired number of additional points can be used for monitoring voltages starting with a single point. The points are, in particular, selected here in such a way that potential interruption points are located between two points including the start 17 and the end 18. Generally, with n additional points (in addition to the start A 17 and the end E 18) it is possible to differentiate between n+1 faulty sections of the current loop with the result that a relatively high number of additional points leads to more precise determination of the location of interruptions, but, under certain circumstances, also to increased complexity of circuitry.

The monitoring of the points 1 and 2 is carried out here in the exemplary embodiment in FIG. 1 by means of a microcontroller 24 which is arranged in the component A19, and the evaluation of the points 3 and 4 is carried out by means of a microcontroller 27 which is arranged in the component B20. In this context, it is, in particular, possible to use microcontrollers which are present in any case in the high-voltage arrangement and which can also be used for other purposes. However, microcontrollers or other processor units which are specially configured for the purpose of monitoring the voltage of the current loop 30 can also be made available. The monitoring apparatus 13 and the microcontrollers 24 and 27 form a monitoring apparatus in the exemplary embodiment in FIG. 1.

The microcontrollers 24 and 27 can be connected, for example, to the monitoring apparatus 13 via a CAN bus 16. In addition, it is also possible to read out the sensed voltages externally and/or determine the location of an interruption by means of the CAN bus 16 as explained below. Other types of connection, for example wireless links, are also possible.

The inputs of the microcontrollers 24, 27 for the voltages at the points 1, 2, 3, 4 can be configured here as pull-up or pull-down inputs.

If, for example, the low-voltage plug 25 is not connected, a different voltage, for example logic high level, occurs for the start A 17 and the points 1 and 2 than for the points 3 and 4 and the end E 18, in particular if the inputs of the microcontrollers 24, 27 have a pull-down resistor, i.e. are configured as pull-down inputs. This means that at least one interruption is present between the point 2 and the point 3, which initially indicates an unplugged plug 25 (or a line break). When the cover 25 is opened, for example a jump in potential would occur between the points 3 and 4. The location of an interruption can therefore be determined more precisely.

Since only binary levels (for example logic high and logic low) are present and are compared in the illustrated exemplary embodiment, the microcontrollers 24, 27 do not have to be specially configured but rather conventional microcontrollers with conventional microcontroller inputs can be used.

In the illustrated exemplary embodiment, the monitoring apparatus 13 can serve, for example, as a coordination device which collects and evaluates the measured values at the points and outputs a result via the CAN bus 16.

In the case of multiple interruptions sections of the current loop 30 can be floating, i.e. be connected to none of the terminals of the low-voltage source 10. In this case, iterative troubleshooting and fault recovery is possible, wherein after a first interruption has been detected and its location determined the interruption is repaired and then a further check, i.e. further evaluation of the voltage levels at the measurement points, takes place and in turn determination of the location and repair are carried out with these steps being repeated until the entire current loop is interruption-free.

Figure 2:
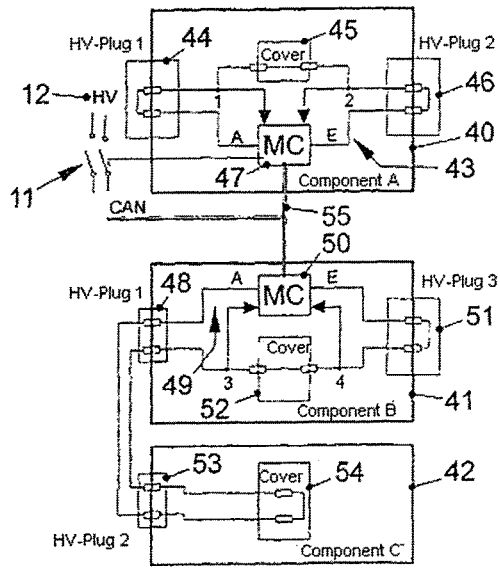
FIG. 2 shows a device for monitoring a high-voltage arrangement according to a second exemplary embodiment.

The disclosed embodiments can be used not only for monitoring devices of a high-voltage arrangement which has, as in FIG. 1, a single current loop 30, but rather it is also possible to use a plurality of current loops. Such an example is illustrated in FIG. 2. In the exemplary embodiment in FIG. 2, a high-voltage arrangement in turn comprises, as an example, three components, specifically a component A 40, a component B 41 and a component C 42. The component A 40 comprises as elements to be monitored a high-voltage plug 44, a cover 45 and a high-voltage plug 46. The component B 41 comprises as components to be monitored a low-voltage plug 48, a cover 52 and a high-voltage plug 51. The component C 42 comprises as components to be monitored a low-voltage plug 53 and a cover 54. A first current loop 43 is laid from a start A to an end E through the elements, to be monitored, of the component A 40, wherein the component A 40 comprises a microcontroller 47 which, in the exemplary embodiment in FIG. 2, feeds the first current loop 43 and monitors voltages at the start A, the end E and points 1 and 2 of the current loop 43. The microcontroller 47 can for this purpose be connected to a low-voltage source.

The elements to be monitored of the component B 41 and of the component C 42 are monitored by a second current loop 49 with a start A and an end E, which second current loop 49 is fed by a microcontroller 50 of the component B 41. The component C 42 does not comprise its own microcontroller and is therefore as it were also monitored by the microcontroller 50. The microcontroller 50 evaluates voltages at the start A and the end E as well as at points 3 and 4 of the second current loop 49. An interruption is detected by the microcontroller 47 in the case of the first current loop 43 and by the microcontroller 50 in the case of the second current loop 49, as described with reference to FIG. 1 for the monitoring apparatus 13.

The microcontroller 47 and the microcontroller 50 are connected to a CAN bus 55. If the microcontroller 50 registers an interruption on the second current loop 49, it signals this via the CAN bus 55 to the microcontroller 47. If the microcontroller 47 receives such a message from the microcontroller 50 or if the microcontroller 47 detects an interruption on the first current loop 43, it opens a switch 11 to interrupt a high-voltage supply 12 in this way. In addition, the microcontrollers 47 and 50 can determine more precisely the location of an occurring interruption by the use of the additional measurement points 1, 2, 3, 4 and can also signal this via the CAN bus 55, wherein the determination of the location can occur as described with reference to FIG. 1.

Iterative determination of location in the case of a plurality of interruptions is also possible as described with reference to FIG. 1.

It is to be noted that it is also possible to use more than two current loops. In the exemplary embodiment in FIG. 2, it is also possible not as illustrated by the microcontrollers 47 and 50 but rather also by direct connection to a low voltage battery and/or a constant current source, as explained with reference to FIG. 1. In addition the evaluation of the voltages can also take place, in particular at a start and an end of the respective current loops, by means of an external monitoring apparatus such as the monitoring apparatus 13 in FIG. 1. Conversely, in the case of the exemplary embodiment in FIG. 1, the current loop can also be fed and/or the voltages evaluated at the start and end of the current loop 30 by means of a microcontroller, for example the microcontroller 24 or the microcontroller 27.

Figure 3:
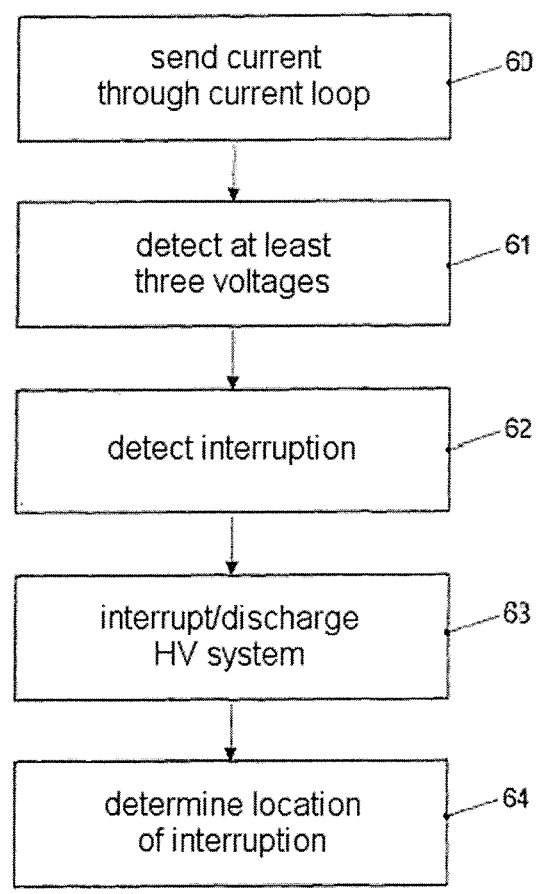
FIG. 3 shows a flowchart for illustrating a method according to an exemplary embodiment.

In FIG. 3, an exemplary embodiment of a method is illustrated, wherein this method can be implemented, for example, by the devices in FIGS. 1 and 2, but can also be used independently thereof.

In step 60, a current of a current loop, which leads through elements, to be monitored, of a high-voltage device, is impressed.

In step 61, voltages are detected at at least three different points of the current loop, i.e. at least three voltages. This can take place entirely or partially by means of microcontrollers which are present in any case in high-voltage components.

In step 62, an interruption in the current loop is detected on the basis of the detected voltages. If such an interruption is detected, in step 63 a high-voltage system is interrupted and then discharged. In step 64 the location of the interruption in the current loop is finally determined on the basis of the detected voltages, wherein in the case of a plurality of interruptions this can also take place iteratively, as described above.

The exemplary embodiments illustrated above serve merely as an example and are not to be interpreted as limiting the scope of the invention. The present invention can be applied, in particular, to high-voltage arrangements in a motor vehicle, in particular a hybrid vehicle or an electric vehicle. The use of the present invention is, however, not restricted to these applications.

Illustrative embodiments relate to methods and devices for monitoring a high-voltage arrangement, in particular in a vehicle. A high-voltage arrangement is understood to be, in particular, an arrangement in which voltages >25 volts, for example voltages >60 volts, can occur, for example, in the field of 400 volts. In particular, this includes voltages of the voltage class B which comprises, for direct voltages, voltages between 60 volts and 500 volts, and for alternating voltages, voltages between 25 volts and 1,000 volts.

Such voltages are used, in particular, in hybrid and electric vehicles, for example, to supply an electric motor.

In the event of faulty or incomplete mounting of such a high-voltage arrangement there is a risk of people being exposed to the high voltage, which can lead to injury or even death. In the case of work on such a high-voltage arrangement it is also desirable to ensure that the corresponding parts of the high-voltage arrangement are not under voltage while they are being worked on. In this respect it is known, for example from DE 10 2008 021 542 A1 or DE 10049196 A1, to lay a low-voltage current loop through the high-voltage arrangement, which loop is led, inter alia, through pluggable and/or removable components which can potentially conduct a high voltage. Such a current loop is also referred to as a pilot line or safety line. For example, when such components are disconnected or removed, the current loop is interrupted, causing the high voltage to be switched off and initiating discharging of the high-voltage arrangement.

For example, DE 10 2009 054 469 A1 discloses special cabling systems which combine high voltage lines and lines of such a current loop.

If only an interruption in the current loop is detected it is possible to ensure reliable disconnection of the high voltage but it is not possible to determine the location of the interruption. For this reason, troubleshooting in the high voltage arrangement after such an interruption may be costly.

In this regard, DE 10 2009 050 223 A1 proposes using electrically actuable switches to monitor and interrupt an electrical high voltage power system of a vehicle, wherein a monitoring unit can monitor the function capability of the electrically actuable switch and therefore determine locations at least in some cases. To actuate the electrically actuable switch it is possible here, in particular, to use a further switch which is sensitive to a faulty situation. However, such an arrangement is relatively costly to implement.

LIST OF REFERENCE NUMERALS 1-4 Points
10 Low-voltage battery
11 Switch
12 High supply
13 Monitoring apparatus
14 Constant current source
15 Resistor
16 CAN bus
17 Start
18 End
19, 20, 21 Components 22 Low-voltage plug
23 High-voltage plug
24 Microcontroller
25 Low-voltage plug
26 Cover
27 Microcontroller
28 High-voltage plug
29 High-voltage plug
30 Current loop
40, 41, 42 Components
43 Current loop
44 High-voltage plug
45 Cover
46 High-voltage plug
47 Microcontroller
48 Low-voltage plug
49 Current loop
50 Microcontroller
51 High-voltage plug
52 Cover
53 Low-voltage plug
54 Cover
60-64 Method steps

The invention claimed is:

1. A method for monitoring a high-voltage arrangement, the method comprising:
impressing a current onto a current loop, wherein the current loop runs through a multiplicity of elements, to be monitored, of the high-voltage arrangement, wherein a change in a state of at least one of the elements to be monitored leads to an interruption in the current loop;
sensing voltages at at least three points on the current loop;
detecting an interruption in the current loop as a function of the voltages;
interrupting a high-voltage supply of the high-voltage arrangement and discharging the high-voltage arrangement when an interruption is detected; and
determining the location of the interruption as a function of the voltages,
wherein the sensing of voltages at at least three points on the current loop comprises sensing a first voltage at a start of the current loop, and sensing a second voltage at an end of the current loop,
wherein the detection of the interruption is the current loop is performed only on the basis of the first voltage and the second voltage, and
wherein the monitoring is performed using a monitoring apparatus which is arranged outside the high-voltage arrangement.

2. The method of claim 1, wherein an interruption in the current loop is detected if a difference between the first voltage and the second voltage exceeds a predefined threshold value.

3. The method of claim 1, wherein at least one of the sensed voltages is sensed by a processor unit which is arranged in a component of the high-voltage arrangement.

4. The method of claim 3, wherein the processor unit is a microcontroller within the component.

5. The method of claim 1, wherein at least one of the sensed voltages comprises at least one further voltage.

6. The method of claim 1, further comprising impressing a further current onto at least one further current loop which runs through a multiplicity of further elements, to be monitored, of the high-voltage arrangement, wherein a change in a state of at least one of the further elements, to be monitored, leads to an interruption in the at least one further current loop, wherein the monitoring device is also configured to sense further voltages at at least three further points on the at least one further current loop, to detect an interruption in the at least one further current loop as a function of the further voltages, to interrupt a high-voltage supply of the high-voltage arrangement in the event of an interruption being detected in the at least one further current loop, and to determine the location of the interruption in the at least one further current loop as a function of the further voltages.

7. The method of claim 1, further comprising iterative determination of the location of a multiplicity of interruptions in the current loop as a function of the voltages.

8. A device for monitoring a high-voltage arrangement, the device comprising:
a current loop which runs through a multiplicity of elements, to be monitored, of the high-voltage arrangement, wherein a change in a state of at least one of the elements, to be monitored, leads to an interruption in the current loop;
a current source, which is coupled to the current loop; and
a monitoring device which is configured to sense voltages at at least three points on the current loop, to detect an interruption in the current loop as a function of the voltages, to open a switch for interrupting a high-voltage supply of the high-voltage arrangement in the event of an interruption being detected, and to discharge the high-voltage arrangement, and
to determine the location of the interruption as a function of the voltages,
wherein the voltages sensed at at least three points on the current loop comprise a first voltage at a start of the current loop, and a second voltage at an end of the current loop,
wherein the detection of the interruption is the current loop is performed only on the basis of the first voltage and the second voltage, and
wherein the monitoring device is arranged outside the high-voltage arrangement.

9. The device of claim 8, wherein the monitoring device comprises at least one processor unit which is arranged in a component of the high-voltage arrangement.

10. The device of claim 8, wherein the monitoring device is coupled to a bus.

11. The device of claim 8, wherein the elements to be monitored comprise a low-voltage plug, a high-voltage plug and/or a cover.

12. The device of claim 8, wherein the device is configured to:
impress a current onto a current loop, wherein the current loop runs through a multiplicity of elements, to be monitored, of the high-voltage arrangement, wherein a change in a state of at least one of the elements to be monitored leads to an interruption in the current loop;
sense voltages at at least three points on the current loop;
detect an interruption in the current loop as a function of the voltages;
interrupt a high-voltage supply of the high-voltage arrangement and discharging the high-voltage arrangement when an interruption is detected; and
determine the location of the interruption as a function of the voltages.

* * * * *